United States Patent
Neary

(10) Patent No.: US 6,947,515 B2
(45) Date of Patent: *Sep. 20, 2005

(54) METHOD FOR MEASURING THE RESPONSE OF A VOLTAGE CONTROLLED OSCILLATOR

(75) Inventor: Michael B. Neary, Manhattan Beach, CA (US)

(73) Assignee: Xerox Corporation, Stamford, CT (US)

( * ) Notice: Subject to any disclaimer, the term of this patent is extended or adjusted under 35 U.S.C. 154(b) by 753 days.

This patent is subject to a terminal disclaimer.

(21) Appl. No.: 10/024,416

(22) Filed: Dec. 21, 2001

(65) Prior Publication Data

US 2003/0118141 A1 Jun. 26, 2003

(51) Int. Cl.[7] .............................................. H03L 7/06
(52) U.S. Cl. ..................................... 375/376; 327/156
(58) Field of Search ................................. 375/373–376; 327/141, 142, 146, 147, 150, 151, 155, 156, 159, 160, 162; 331/DIG. 2

(56) References Cited

U.S. PATENT DOCUMENTS

| | | | |
|---|---|---|---|
| 5,377,233 A | 12/1994 | Girmay et al. | 375/119 |
| 6,151,152 A | 11/2000 | Neary | 359/216 |
| 6,178,031 B1 | 1/2001 | Rauch et al. | 359/216 |
| 6,288,574 B1 | 9/2001 | Neary | 327/12 |
| 6,529,055 B1 * | 3/2003 | Neary | 327/156 |
| 6,545,545 B1 * | 4/2003 | Fernandez-Texon | 331/1 R |
| 6,826,246 B1 * | 11/2004 | Brown et al. | 375/376 |

* cited by examiner

Primary Examiner—Amanda T. Le
(74) Attorney, Agent, or Firm—Oliff & Berridge, PLC

(57) ABSTRACT

A method for calibrating a VCO within a phase locked loop circuit is disclosed. First, a DAC output voltage is set to its minimum, and a counter M is adjusted until a comparator is its threshold voltage. Next, the DAC is set to another voltage, and counter M is again adjusted to the comparator threshold. This process is repeated for as many steps as desired. When the phase locked loop circuit requests an instantaneous frequency, an interpolation of the requested frequency against the curve created by the above-described method gives the value required by the DAC.

14 Claims, 2 Drawing Sheets

METHOD FOR MEASURING THE RESPONSE OF A VOLTAGE CONTROLLED OSCILLATOR

BACKGROUND OF THE INVENTION

This application is related to U.S. patent application entitled, "Method for Adjusting the Center Frequency of a Phase Locked Loop" Ser. No. 10/024,241 filed concurrently herewith.

This invention relates to adjusting the frequency of a voltage-controlled oscillator in order to match the timing of pixels to the actual time of flight on a raster output scanner. The described method allows field calibration of the VCO without instruments or any additional hardware.

Referring to FIG. 1, there is shown a tangential (fast-scan) view of a prior art raster output scanner 10 of a printing system. The raster scanning system 10 utilizes a laser light source 12, a collimator 14, pre-polygon optics 16, a multi-faceted rotating polygon mirror 18 as the scanning element, post polygon optics 20 and a photosensitive medium 22.

The laser light source 12 sends a light beam 24 to the rotating polygon mirror 18 through the collimator 14 and the pre-polygon optics 16. The collimator 14 collimates the light beam 24 and the pre-polygon optics 16 focuses the light beam 24 in the sagittal or cross-scan plane onto the rotating polygon mirror 18. The facets 26 of the rotating polygon mirror 18 reflect the light beam 24 and cause the reflected light beam 24 to revolve about an axis near the reflection point of the facet 26. The reflected light beam 24 is utilized through the post polygon optics 20 to scan a document at the input of an imaging system or can be used to impinge upon a photographic film or a photosensitive medium 22, such as a xerographic drum at the output of an imaging system. Hereinafter, for the purpose of simplicity the "rotating polygon mirror" will be referred to as "polygon".

In this process, depending on the manufacturing tolerances, each facet might have different characteristics such as a minute width variation which can cause the line scanned by this facet to be scanned faster or slower than average scan time. This type of error is called facet to facet error. In order to correct this problem, it is best to check the error of each facet compared to the average speed of the polygon (average scan time) which is the average speed of all the facets of the polygon.

To find the facet to facet or the reference frequency errors, the time difference between the arrival times of the end of scan and end of count signals of each facet has to be measured. Typically, an analog phase detector is used to measure this time difference. However, analog circuits and analog outputs are not practical in the digital world. Currently, in order to calibrate the voltage-controlled oscillator for reducing frequency errors is to measure the varactor and all other components in the voltage-controlled oscillator, compare these measurements to the circuit performance and calculate an expected range of within which the circuit is expected to perform.

Therefore it would be desirable to design a phase locked loop circuit that performs adjustment of the frequency of the voltage controlled oscillator by measuring and correcting itself in the field during operation. The present invention solves this problem in a unique and novel manner.

SUMMARY OF THE INVENTION

According to the present invention, a method for calibrating a VCO within a phase locked loop circuit is provided.

First, a DAC output voltage is set to its minimum, and a counter M is adjusted until a comparator is its threshold voltage. Next, the DAC is set to another voltage, and counter M is again adjusted to the comparator threshold. This process is repeated for as many steps as desired. When the phase locked loop circuit requests an instantaneous frequency, an interpolation of the requested frequency against a curve created by the above-described method gives the value required by the DAC.

DESCRIPTION OF THE PREFERRED EMBODIMENT

Figure 1:
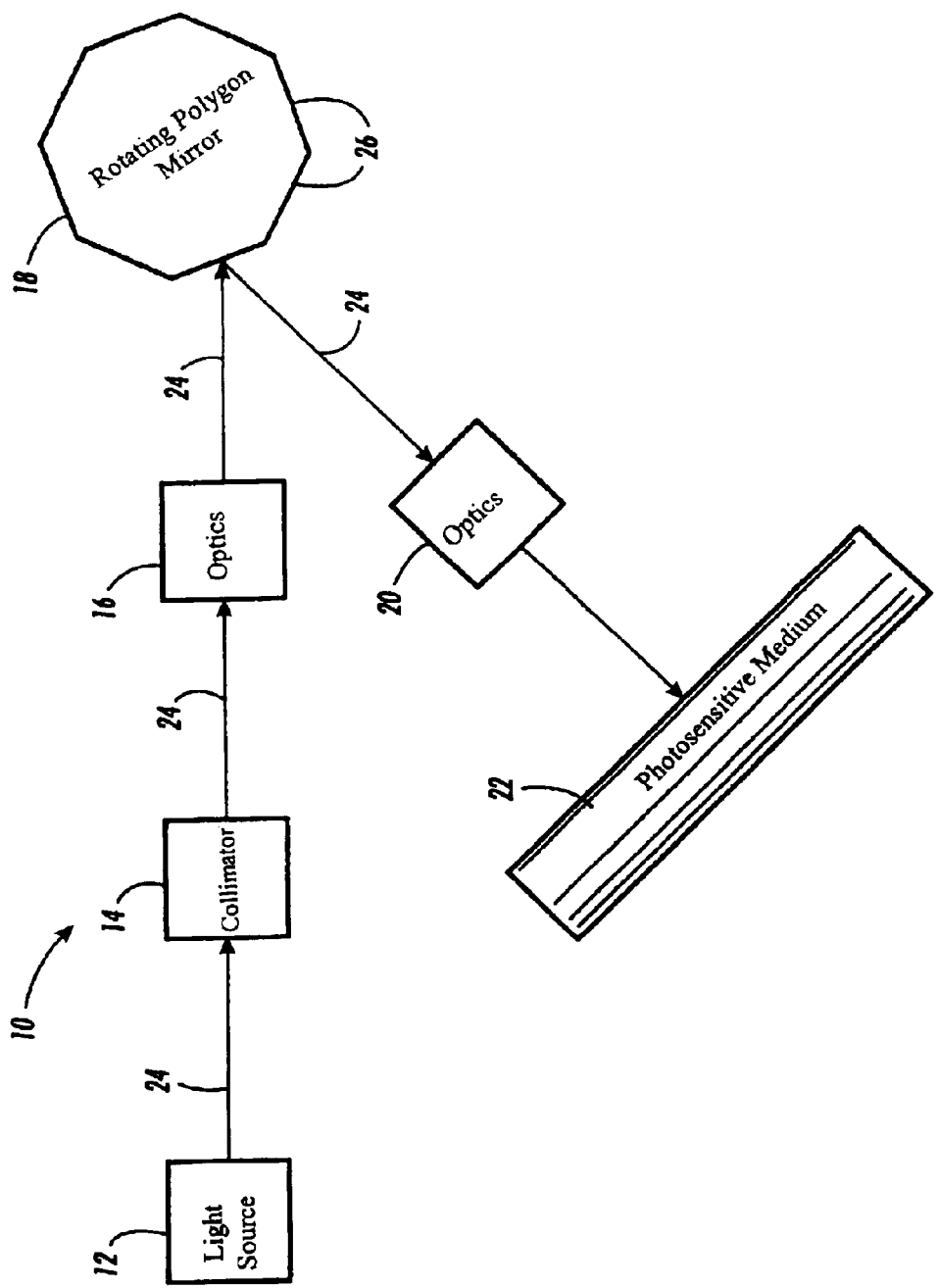
FIG. 1 shows a tangential (fast-scan) view of a prior art raster output scanner of a printing system.
Figure 2:
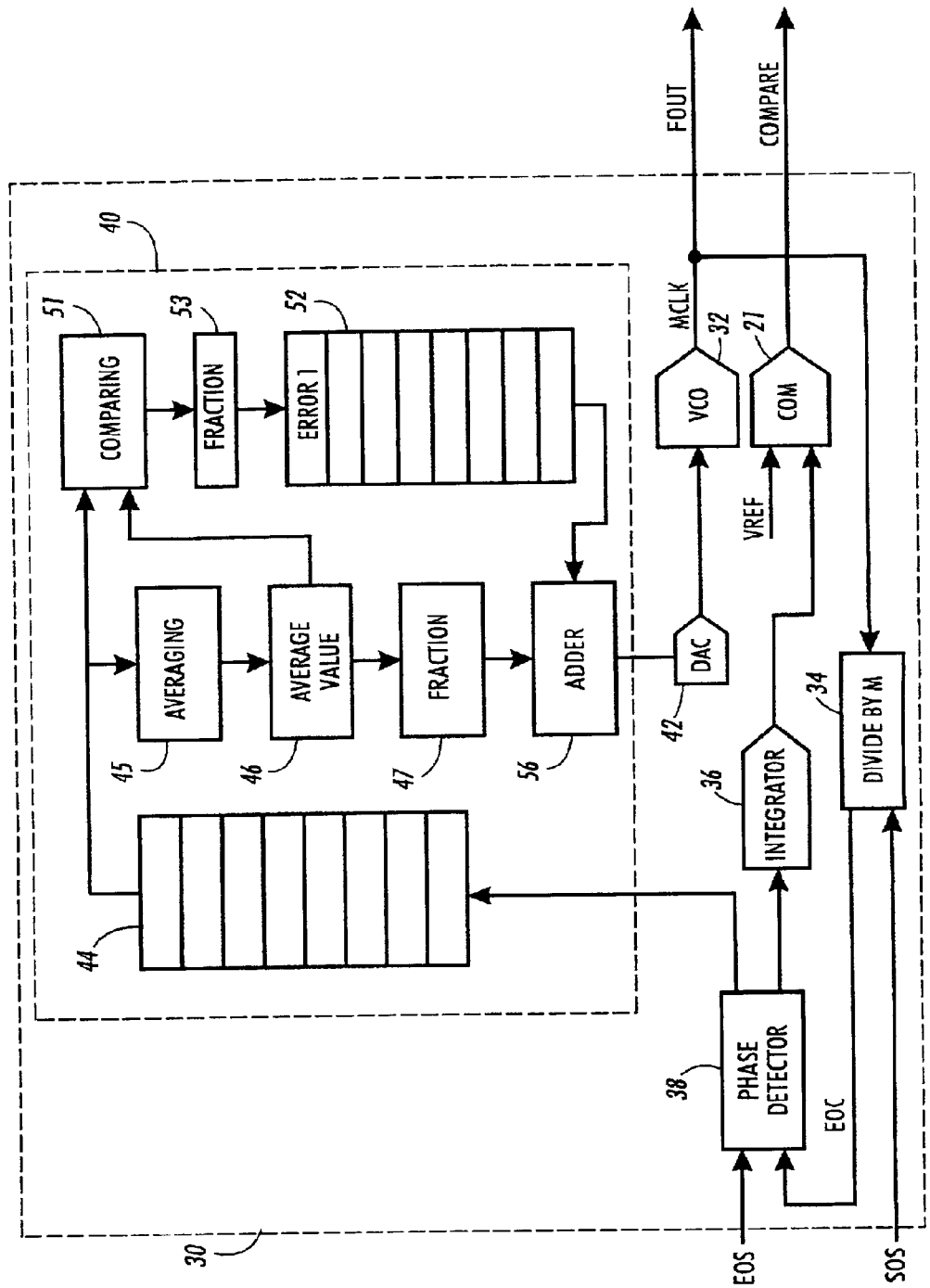
FIG. 2 shows a block diagram of a phase locked loop of the present invention which is designed to perform adjustments to the frequency of a voltage controlled oscillator.

Referring to FIG. 2, there is shown a block diagram of a phase locked loop circuit 30 of this invention which is designed to perform adjustments to the frequency of a voltage controlled oscillator used with the phase locked loop circuit. In FIG. 2, a voltage controlled oscillator (VCO) 32, a divider or counter 34, a digital phase detector 38, a integrator 36, a comparator 21, a microprocessor 40, and a digital to analog converter (DAC) 42 are utilized to generate an accurate main clock Mclk having an output VCO frequency. The main clock Mclk will be synchronized with the start of scan (SOS) to generate the pixel clock (Pclk).

Typically, a raster output scanner (ROS) system has two sensors to detect the start of scan (SOS) and the end of scan (EOS). As the scanning laser light beam passes over a dedicated spot on the scan line immediately prior to pixel placement, the respective sensor generates a start of scan SOS. In the same manner, as the scanning laser light beam passes over a dedicated spot on the scan line immediately after the end of pixel placement, the respective sensor generates an end of scan EOS. The SOS and the EOS are being generated for each scan line. Also, scan linearity correction may be achieved by injecting a voltage into the frequency determining portion of the VCO 32, such that voltages applied effect transient changes in the VCO frequency. These changes in voltage are used to vary the time that a given pixel appears, so that each pixel may be aligned with the actual location of the laser beam scan.

Within the phase locked loop 30, the voltage controlled oscillator VCO (clock generator) 32 generates a main clock Mclk signal at an oscillator frequency or VCO frequency. The Mclk signal is sent to divider 34 which divides the Mclk by M to serially generate a plurality of end of count (EOC) pulses which are sent out as an EOC signal indicating the end of pixel information and then sent to a phase detector 38. Each one of the plurality of EOC pulses corresponds to one of the plurality of facets of the rotating polygon mirror. M is the total number of pixels per scan line. For example, for a 14.4 inch paper with 600 pixels per inch, M is 8640.

The phase detector 38 receives the internally generated EOC signal and an EOS signal from the ROS system. The phase detector 38 increases or decreases the voltage into the VCO 32 according to the difference between the EOS signal and the EOC signal. The EOS signal is a plurality of serially sent end of scan pulses where each pulse corresponds to one of the plurality of the facets of the rotating polygon mirror.

The EOS and EOC pulses of each facet should arrive to the phase detector 38 at the same time. However, for various reasons such as characteristics of different facets, the EOS pulse might arrive to the phase detector 38 before or after the EOC pulse. When the EOC pulse arrives first, the phase detector 38 increases the voltage into the VCO thereby increasing the frequency and decreasing the time before the EOC arrives. When the EOS and EOC are simultaneous, the phase detector 38 does not change the oscillator frequency. For the purpose of simplicity, hereinafter, the EOS pulse and EOC pulse are referred to as EOS and EOC respectively.

For each facet, the phase detector 38 compares and measures the time difference between the EOS and EOC and sends out a digital time value for the delay between the two signals. The time difference (digital time value) between the EOS and EOC of each facet is sent to a lookup table 44. The lookup table 44 has an individual addressable location for the time difference of each facet. The phase detector 38 continuously measures the time difference between the EOC and EOS of each facet and refreshes the time difference stored in the lookup table 44.

It should be noted that, in FIG. 2, blocks 44, 45, 46, 47, 51, 52, 53, and 56 shown within the microprocessor 40, are not the actual blocks of the microprocessor 40. They only depict the functions that microprocessor 40 performs and if one desires, microprocessor 40 can be replaced by electronic blocks which can perform the same functions as those of the blocks 44, 45, 46, 47, 51, 52, 53, and 56. It should further be noted that, in this specification, the word "microprocessor 40" and each one of the words "blocks 45, 47, 51, 53, and 56" are used interchangeably.

Microprocessor 40 or the averaging block 45 adds the time difference of all the facets of the polygon and divides the total by the number of facets to generate an average time value. The average time value will be stored in the average value block 46. Since the values of the lookup table 44 are refreshed at every rotation of the polygon, microprocessor 40 can be programmed to either recalculate the average time at the end of each polygon rotation or continuously recalculate the average time as the values in the lookup table 44 change.

The calculated average time value is used to correct the reference frequency error. In operation, if EOC arrives to the phase detector 38 before or after the EOS, this indicates that the Mclk is too fast or too slow respectively. Based on the same logic, if the average time has a positive value, it means that during the respective rotation of the polygon, Mclk has been fast for the majority of facets and if the average time has a negative value, it means that during the respective rotation of the polygon, Mclk has been slow for the majority of facets. Therefore, if the average time difference is positive, then the reference frequency needs to be decreased. If the average time difference is negative, the reference frequency needs to be increased.

The average time value is sent to a fraction block 47 which generates a correction value based on the average time value. The correction value from the fraction block 47 is sent to the VCO 32 through the DAC 42 which converts the digital signal to an analog signal before delivering it to the VCO 42. The output voltage of DAC controls the frequency of VCO 42 and causes the VCO 42 to increase or decrease the frequency of Mclk depending on if the digital correction value from the microprocessor 40 was higher or lower than previous value. Since microprocessor 40 can continuously recalculate the average time, the frequency of the main clock can be continuously adjusted. This allows the reference clock to follow a changing polygon speed as may sometimes be required during printer calibration.

Depending on the system requirements, the reference frequency adjustment can be performed in one step or in several steps. If it is desired to correct all of the reference frequency error in a single step, the fraction block 47 will be programmed to send out the entire value of the average time as a correction value. However, if it is desired to gradually correct the reference frequency error, then the fraction block 47 will be programmed to send out a given fraction of the average time value as the correction value. Of course, the given fraction can be programmed to have any desired value.

It should be noted that an alternative way to use a fraction of the average time value is to place fraction block 47 before the lookup table 44 to store a fraction of the time difference of each facet and then generate an average value from the stored values.

Referring once again to FIG. 2, at the beginning of operation (power up), the microprocessor 40 sends out a value to the DAC 42 to cause the VCO 32 to start generating the Mclk. Initially, the frequency of Mclk might be too fast or too slow. Therefore, the DAC 42 output is set to its nominal setting which, by way of example but not of limitation, may be at the center of its range. The VCO frequency is at equilibrium, and the phase detector 38 output is inactive. The voltage output of the integrator 36 is near the threshold voltage of the comparator 21.

In accordance with the present invention, to calibrate the VCO 32, the period between SOS and EOS is held constant, and the DAC 42 output voltage is changed. First, the DAC 42 output voltage is set to its minimum, and the counter M 34 is adjusted until the comparator 21 is again at its threshold. Next the DAC 42 is set to another voltage, and counter M is again adjusted to the comparator 21 threshold. This process is repeated for as many intervals as desired. By way of example, but not of limitation, nine evenly spaced intervals may be used to meet the precision requirements. At the conclusion of this procedure, the DAC 42 value is returned to its nominal value. This returns the integrator 36 output to its value near the threshold of the comparator 21.

Once again, by way of example only, the resulting nine values of M are then tabulated against the DAC 42 voltage settings. Knowing the SOS to EOS period, the exact frequency for any value of DAC 42 output is equal to (f=M/period), where M is an integer, f may be in megahertz, and period may be in microseconds. When the Non Linearity algorithm requests an instantaneous frequency, an interpolation of the requested frequency against the curve created by the process above gives the value required by the DAC 42. Therefore, the continuous time values sent from the phase detector 38 cause the microprocessor 40 to adjust the frequency of the Mclk and substantially reduce the reference frequency error.

Since the current state of the art in oscillator design makes it costly to provide tight tolerance for frequency determining components in this circuit, the measurement technique described here allows achieving these tolerances at minimal cost. The frequency response may be measured at any time, so that any changes in operating conditions may be accommodated.

Turning once again to FIG. 2, during operation, microprocessor 40 or comparing block 51 calculates the difference between the time difference of each facet and the average time to generate an error for each facet. The errors are sent to a lookup table 52 through a fraction block 53 to be stored in individually addressable locations of the lookup table 52. After each rotation of the polygon, microprocessor 40 recalculates these errors, adds or subtracts the newly calculated errors to/from the values in the lookup table 52 depending on if the newly calculated error is more or less than the previous error respectively and stores the result (adjusted error value) in the lookup table 52.

Fraction block 53 can be programmed to store the entire value or a fraction of the error value in the lookup table 52. The fraction block provides the option of applying the entire error value to correct the facet to facet error in one step or use a fraction of the error to gradually correct the facet to facet error.

For each facet, microprocessor 40 will select the respective adjusted error value from the lookup table 52 and sends it to the DAC 42 through the adder 56. Adder 56 receives the error and the average time value and adds them to generate and send a correction value to DAC 42.

When the facet errors are fully corrected, then the values from the phase detector 38 will only indicate reference frequency errors. Therefore, after the system has obtained a stable profile of the facet error, the comparing block 51 can be stopped to keep the error values of the lookup table 52 fixed in order to freeze the facet to facet correction at its optimum value.

It should further be noted that numerous changes in details of construction, combination, and arrangement of elements may be resorted to without departing from the true spirit and scope of the invention as hereinafter claimed.

What is claimed is:

1. A method for measuring the response of a voltage controlled oscillator within a phase locked loop comprising:
   a) setting a voltage output of an integrator near a threshold voltage of an output of a comparator;
   b) holding a time period between a start of scan pulse and an end of scan pulse constant;
   c) setting a digital to analog converter output voltage to its minimum value;
   d) adjusting a counter M until said comparator output equals said threshold voltage,
   e) setting the digital to analog converter output voltage to another output voltage;
   f) repeating steps (d) through (e) for as many intervals to meet precision requirements, and
   g) returning said counter M to its nominal value which returns said voltage output of said integrator near said threshold voltage of the output of said comparator.

2. The method according to claim 1, further comprising: repeating steps d through e for nine intervals.

3. The method according to claim 1, further comprising: tabulating said M values against digital to analog values.

4. The method according to claim 3, further comprising: calculating an exact frequency for any voltage output of a digital to analog output.

5. The method according to claim 2, further comprising: providing a voltage output required by a digital to analog comparator when an instantaneous frequency is requested by the phase lock loop circuit by use of interpolation to create a requested frequency curve.

6. A phase locked loop circuit comprising:
   an integrator having a voltage output set near a threshold voltage of an output of a comparator;
   a digital to analog converter output set to a minimum value;
   a counter M continuously adjusted until said comparator output equals said threshold voltage, wherein said digital to analog converter output voltage is changed in stepwise fashion to another output voltage in association with said counter M for as many intervals needed to meet precision requirements.

7. A phase lock loop circuit according to claim 6, further comprising:
   said counter M returned to its nominal value which returns said voltage output of said integrator near said threshold voltage of the output of said comparator.

8. A phase lock loop circuit according to claim 6, further comprising:
   said output of said digital to analog converter changed nine times.

9. A phase lock loop circuit according to claim 6, further comprising:
   said M values tabulated against digital to analog values.

10. The phase lock loop circuit according to claim 6, further comprising:
    an exact frequency calculated for any voltage output of said digital to analog output.

11. The phase lock loop circuit according to claim 6, further comprising:
    a requested frequency curve created by interpolation when said voltage output is required by a digital to analog comparator when an instantaneous frequency is requested by the phase lock loop circuit.

12. A phase locked loop system comprising:
    means for setting a voltage output of an integrator near a threshold voltage of an output of a comparator;
    means for holding a time period between a start of scan pulse and an end of scan pulse constant;
    means for setting a digital to analog converter output voltage to its minimum value;
    means for adjusting a counter M until said comparator output equals said threshold voltage;
    means for setting the digital to analog converter output voltage to another output voltage wherein said means for adjusting and setting are repeated for as many intervals as necessary to meet precision requirements;
    means for returning said counter M to its nominal value which returns said voltage output of said integrator near said threshold voltage of said comparator; and
    means for calculating an exact frequency for any voltage output of a digital to analog output.

13. The phase lock loop system according to claim 12, further comprising:
    means for tabulating said M values against digital to analog values.

14. The phase lock loop system according to claim 12, further comprising:
    means for providing a voltage output required by a digital to analog comparator when an instantaneous frequency is requested by the phase lock loop circuit by use of interpolation to create a requested frequency curve.

* * * * *